(12) United States Patent
Wang et al.

(10) Patent No.: US 9,136,762 B2
(45) Date of Patent: Sep. 15, 2015

(54) CURRENT SLOPE CONTROL METHOD AND APPARATUS FOR POWER DRIVER CIRCUIT APPLICATION

(71) Applicant: STMicroelectronics (Shenzhen) R&D Co. Ltd., Nanshan, Shenzhen (CN)

(72) Inventors: Meng Wang, Shenzhen (CN); Tao Tao Huang, Shenzhen (CN)

(73) Assignee: STMicroelectronics (Shenzhen) R&D Co. Ltd, Shenzhen (CN)

( * ) Notice: Subject to any disclaimer, the term of this patent is extended or adjusted under 35 U.S.C. 154(b) by 288 days.

(21) Appl. No.: 13/875,651

(22) Filed: May 2, 2013

(65) Prior Publication Data

US 2013/0300394 A1    Nov. 14, 2013

(30) Foreign Application Priority Data

May 11, 2012   (CN) .......................... 2012 1 0153152

(51) Int. Cl.
 H05B 37/02    (2006.01)
 H02M 3/158    (2006.01)
 H03K 17/0412  (2006.01)
 G09G 3/32     (2006.01)

(52) U.S. Cl.
 CPC ......... *H02M 3/158* (2013.01); *H03K 17/04123* (2013.01); *G09G 3/3208* (2013.01); *G09G 2310/0259* (2013.01); *G09G 2320/041* (2013.01); *G09G 2320/043* (2013.01); *G09G 2330/02* (2013.01); *G09G 2330/025* (2013.01)

(58) Field of Classification Search
None
See application file for complete search history.

(56) References Cited

U.S. PATENT DOCUMENTS

| 8,093,878 | B2 | 1/2012 | Goto et al. |
| 8,988,056 | B2 | 3/2015 | Smith, Jr. et al. |
| 2005/0017767 | A1* | 1/2005 | Huang et al. ................. 327/110 |
| 2006/0132194 | A1* | 6/2006 | Harriman ....................... 327/108 |
| 2008/0136467 | A1 | 6/2008 | Tambouris et al. |
| 2013/0313993 | A1* | 11/2013 | Wang et al. ................... 315/240 |

* cited by examiner

*Primary Examiner* — Long Nguyen
(74) *Attorney, Agent, or Firm* — Gardere Wynne Sewell LLP

(57) ABSTRACT

A low side driver includes a first transistor coupled in series with a second transistor at a low side voltage node for a load. A capacitance is configured to store a voltage and a voltage buffer circuit has an input coupled to receive the voltage stored by the capacitance and an output coupled to drive a control node of the second transistor with the stored voltage. A current source supplies current through a switch to the capacitance and the input of the voltage buffer circuit. The switch is configured to be actuated by an oscillating enable signal so as to cyclically source current from the current source to the capacitance and cause a stepped increase in the stored voltage which is applied by the buffer circuit to the control node of the second transistor.

30 Claims, 4 Drawing Sheets

CURRENT SLOPE CONTROL METHOD AND APPARATUS FOR POWER DRIVER CIRCUIT APPLICATION

PRIORITY CLAIM

This application claims priority from Chinese Application for Patent No. 201210153152.6 filed May 11, 2012, the disclosure of which is hereby incorporated by reference.

BACKGROUND

1. Technical Field

The present invention relates generally to power driver circuits and their operation and in particular to method and apparatus for controlling current slope of a control signal for a power driver.

2. Introduction

Reference is made to FIG. 1 which shows a circuit diagram of a power driver circuit 100. The circuit 100 includes a high side driver 102 and a low side driver 104. The output of the high side driver 102 is coupled to a high side node 106 of a load 108. The output of the low side driver 104 is coupled to a low side node 110 of the load 108. In the exemplary implementation of FIG. 1, the load 108 is a display panel of an LCD or AMOLED type and the high side node 106 and low side node 110 are the voltage supply nodes for the display panel. It will be understood, however, that the load 108 may comprise any suitable load driven from both the high and low side.

The high side driver 102 comprises a pair of series connected transistors 120 and 122. The transistors 120 and 122 are of the n-channel MOSFET type coupled in series through their source-drain paths. It will be understood that transistors of other type may instead be used, the reference to n-channel MOSFET devices being exemplary only of a preferred implementation. P-channel MOSFETs, combinations of n-channel and p-channel MOSFETs, bi-polar devices and/or IGFET type devices may alternatively be used.

The transistor 120 includes a conduction (drain) terminal coupled to a first power supply node 124 and a conduction (source) terminal coupled to the high side node 106. A control (gate) terminal of the transistor 120 is coupled to a first control node 126. The transistor 122 includes a conduction (drain) terminal coupled to the high side node 106 and a conduction (source) terminal coupled to a second power supply node 128. A control (gate) terminal of the transistor 122 is coupled to a second control node 130.

The low side driver 104 comprises a pair of series connected transistors 140 and 142. The transistors 140 and 142 are of the n-channel MOSFET type coupled in series through their source-drain paths. It will be understood that transistors of other type may instead be used, the reference to n-channel MOSFET devices being exemplary only of a preferred implementation. P-channel MOSFETs, combinations of n-channel and p-channel MOSFETs, bi-polar devices and/or IGFET type devices may alternatively be used.

The transistor 140 includes a conduction (drain) terminal coupled to a third power supply node 144 and a conduction (source) terminal coupled to the low side node 110. A control (gate) terminal of the transistor 140 is coupled to a third control node 146. The transistor 142 includes a conduction (drain) terminal coupled to the low side node 110 and a conduction (source) terminal coupled to a fourth power supply node 148. A control (gate) terminal of the transistor 142 is coupled to a fourth control node 150.

The first and third power supply nodes 124 and 144 are preferably coupled to receive high supply voltages (for example, Vdd1 and Vdd2). These may, for example, be different high supply voltages, or the same high supply voltage, depending on circuit application.

The second and fourth supply nodes 128 and 148 are preferably coupled to receive low supply voltages. These may, for example, be different low supply voltages, or the same low supply voltage (for example, ground), depending on circuit application.

Reference is now made to FIG. 2 which illustrates voltage waveforms for the voltage signals at the high side node 106 (voltage signal Va) and low side node 110 (voltage signal Vb). These waveforms are specific to the exemplary implementation of FIG. 1 where the load 108 is a display panel of an LCD or AMOLED type. It will be understood, however, that high and low side waveforms having a similar shape and timing may be applicable with other types of loads.

During a period of time associated with resetting the display panel load 108 (of an LCD or AMOLED type), the high side driver 102 and low side driver 104 are controlled by application of appropriate control signaling to the first, second, third and fourth control nodes 126, 130, 146 and 150 of the transistors 120, 122, 140 and 142, respectively, to pull down the voltage at the high side node 106 (voltage signal Va) as indicated at reference 160. The reset time period terminates when the voltage at the high side node 106 (voltage signal Va) returns high. During a first time period t1 associated with initially pulling down the voltage at the high side node 106, it is important to exercise control over the downward voltage slope. In particular, there is a need to control the slope in a manner which ensures that no voltage/current spike is introduced during the power driving operation.

During a period of time associated with emission in the display panel load 108 (of an LCD or AMOLED type), the high side driver 102 and low side driver 104 are controlled by application of appropriate control signaling to the first, second, third and fourth control nodes 126, 130, 146 and 150 of the transistors 120, 122, 140 and 142, respectively, to pull down the voltage at the low side node 110 (voltage signal Vb) as indicated at reference 162. The emission time period terminates when the voltage at the low side node 110 (voltage signal Vb) returns high. During a second time period t2 associated with initially pulling down the voltage at the low side node 110, it is important to exercise control over the downward voltage slope. In particular, there is a need to control the slope in a manner which ensures that no voltage/current spike is introduced during the power driving operation.

SUMMARY

In an embodiment, a circuit comprises: a low side driver including a first transistor coupled in series with a second transistor at a low side voltage node, said low side voltage node configured to be coupled to a load; a capacitance configured to store a voltage; a voltage buffer circuit having an input coupled to receive the voltage stored by the capacitance and an output coupled to drive a control node of the second transistor with said stored voltage; a first current source; and a first switch coupled between the first current source and the input of the voltage buffer circuit, wherein said first switch is configured to be actuated by an oscillating enable signal so as to cyclically source current from said first current source to said capacitance and cause a stepped increase in the stored voltage.

In an embodiment, a circuit that is configured to drive a low side driver including a drive transistor coupled between a low side voltage node of a load and a reference voltage comprises: a first circuit configured to sense a threshold voltage of the drive transistor; a capacitance configured to store a voltage; a second circuit configured to cause the sensed threshold voltage to be stored as an initial voltage stored by said capacitance; a first current source; a first switch coupled between the first current source and the capacitance, where said first switch configured to be actuated by an oscillating enable signal so as to cyclically source current from said first current source to said capacitance and cause a stepped increase of the voltage stored by said capacitance from said initial voltage; and a voltage buffer circuit having an input coupled to receive the voltage stored by the capacitance and an output coupled to drive a control node of the drive transistor with said stored voltage.

In another embodiment, a circuit that is configured to drive a low side driver including a first drive transistor coupled between a low side voltage node of a load and a reference voltage comprises: a control transistor coupled between the control node of the first drive transistor and a reference voltage, said control transistor having a control node configured to receive a drive control signal; a capacitance configured to store a voltage; a first circuit configured to pre-charge the control node of the first drive transistor to a voltage which is stored as an initial voltage stored by said capacitance, said first circuit actuated in response to said drive control signal; a first current source; a first switch coupled between the first current source and the capacitance, where said first switch configured to be actuated by an oscillating enable signal so as to cyclically source current from said first current source to said capacitance and cause a stepped increase in the stored voltage; and a voltage buffer circuit having an input coupled to receive the voltage stored by the capacitance and an output coupled to drive a control node of the first drive transistor with said stored voltage.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF THE DRAWINGS

Embodiments are illustrated by way of example in the accompanying figures not drawn to scale, in which like reference numbers indicate similar parts, and in which.

DETAILED DESCRIPTION OF THE DRAWINGS

Figure 1:
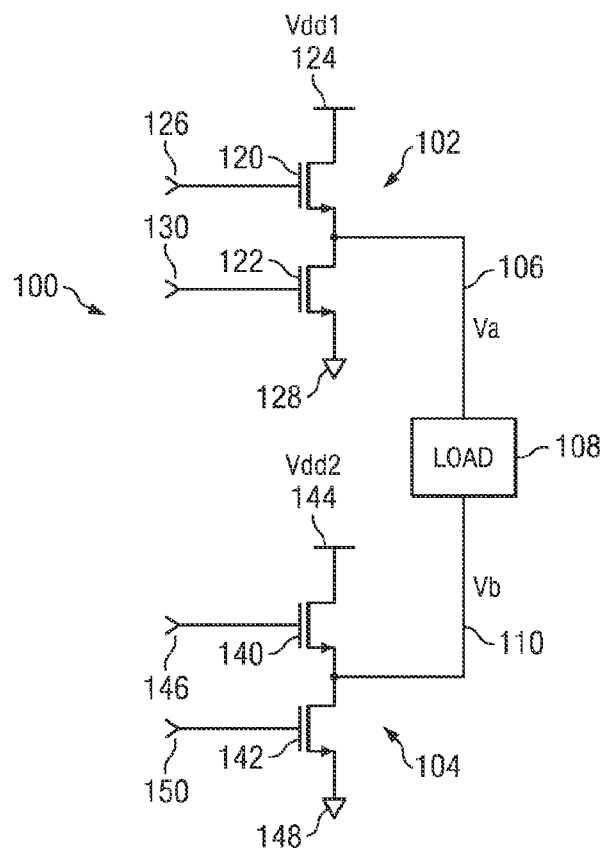
FIG. 1 is a circuit diagram of a power driver circuit.
Figure 2:
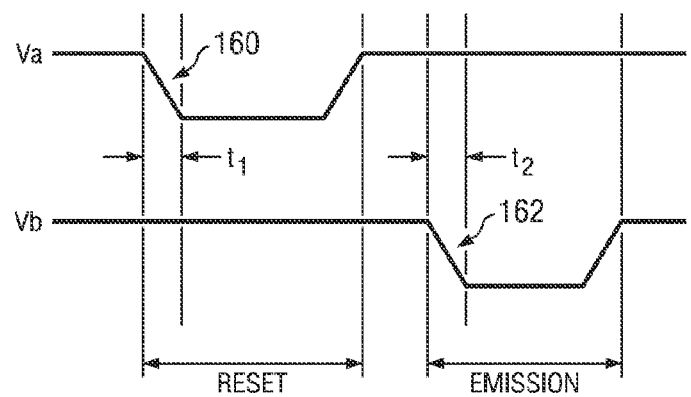
FIG. 2 illustrates voltage waveforms for the voltage signals at the high side node and low side node of the circuit in FIG. 1.
Figure 3:
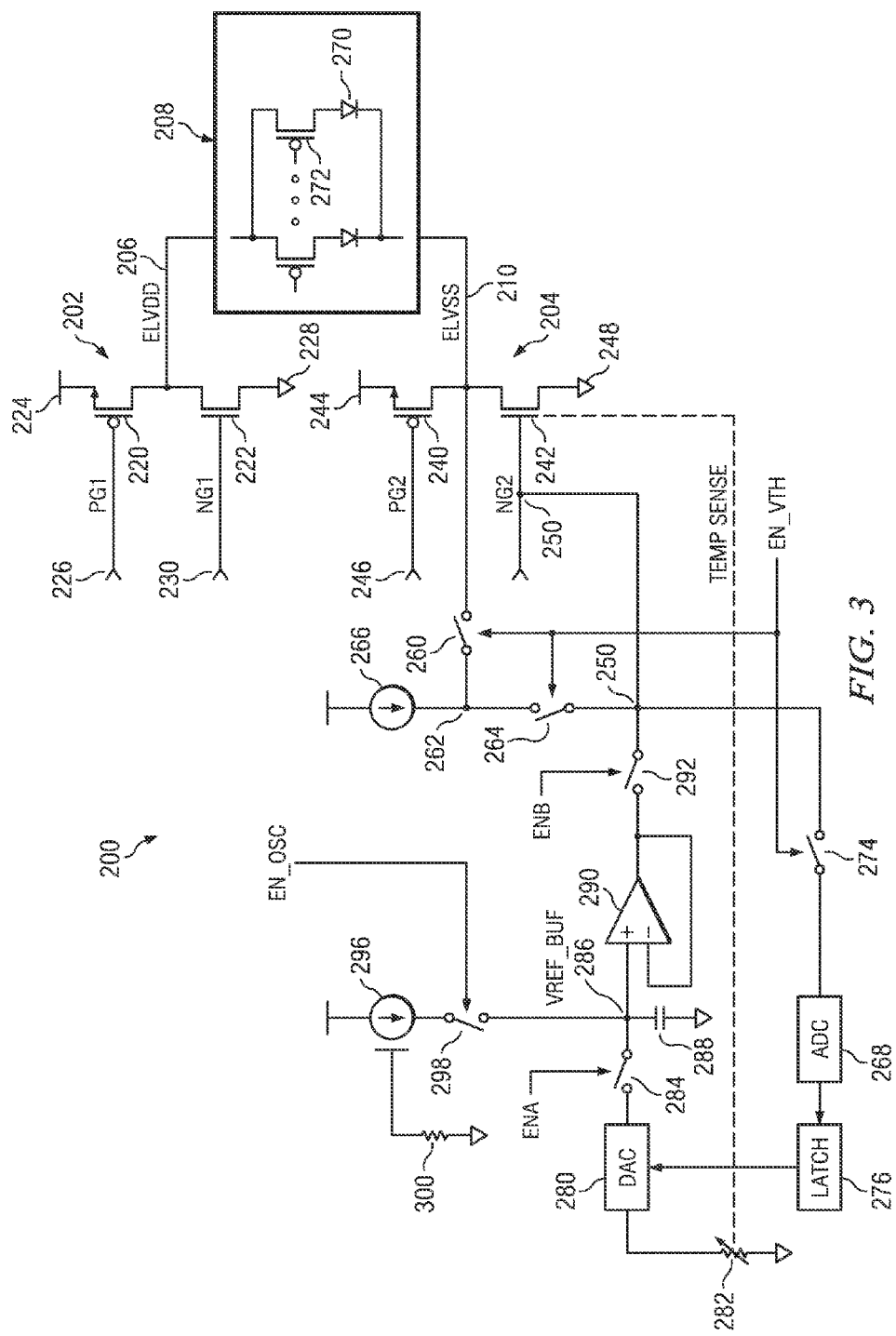
FIG. 3 is a diagram of a first embodiment of an open loop control circuit.

Reference is now made to FIG. 3 showing a diagram of a first embodiment of an open loop control circuit 200. The circuit 200 includes a high side driver 202 and a low side driver 204. The output of the high side driver 202 is coupled to a high side node (ELVDD) 206 of a load 208. The output of the low side driver 204 is coupled to a low side node 210 (ELVSS) of the load 208. In the exemplary implementation of FIG. 3, the load 208 is a display panel of an LCD or AMOLED type which includes a plurality of diodes 270, each diode coupled in series with a control transistor 272 between the high side node (ELVDD) 206 and the low side node 210 (ELVSS). It will be understood, however, that the load 208 may comprise any suitable load driven from both the high and low side.

The high side driver 202 comprises a pair of series connected transistors 220 and 222. The transistor 220 is of the p-channel MOSFET type and the transistor 222 is of the re-channel MOSFET type. These transistors are coupled in series through their source-drain paths. It will be understood that transistors of other type may instead be used, the reference to p-channel and n-channel MOSFET devices being exemplary only of a preferred implementation. P-channel MOSFETs, n-channel MOSFETs, bi-polar devices and/or IGFET type devices may alternatively be used.

The transistor 220 includes a conduction (source) terminal coupled to a first power supply node 224 and a conduction (drain) terminal coupled to the high side node 206. A control (gate) terminal of the transistor 220 is coupled to a first control node 226 (PG1). The transistor 222 includes a conduction (drain) terminal coupled to the high side node 206 and a conduction (source) terminal coupled to a second power supply node 228. A control (gate) terminal of the transistor 222 is coupled to a second control node 230 (NG1).

The low side driver 204 comprises a pair of series connected transistors 240 and 242. The transistor 240 is of the p-channel MOSFET type and the transistor 242 is of the re-channel MOSFET type. These transistors are coupled in series through their source-drain paths. It will be understood that transistors of other type may instead be used, the reference to p-channel and n-channel MOSFET devices being exemplary only of a preferred implementation. P-channel MOSFETs, n-channel MOSFETs, bi-polar devices and/or IGFET type devices may alternatively be used.

The transistor 240 includes a conduction (source) terminal coupled to a third power supply node 244 and a conduction (drain) terminal coupled to the low side node 210. A control (gate) terminal of the transistor 240 is coupled to a third control node 246 (PG2). The transistor 242 includes a conduction (drain) terminal coupled to the low side node 210 and a conduction (source) terminal coupled to a fourth power supply node 248. A control (gate) terminal of the transistor 242 is coupled to a fourth control node 250 (NG2).

The first and third power supply nodes 224 and 244 are preferably coupled to receive high supply voltages. These may, for example, be different high supply voltages, or the same high supply voltage, depending on circuit application.

The second and fourth supply nodes 228 and 248 are preferably coupled to receive low supply voltages. These may, for example, be different low supply voltages, or the same low supply voltage (for example, ground), depending on circuit application.

The circuit 200 further comprises a first switch 260 coupled between the low side node 210 and a first intermediate node 262, and a second switch 264 coupled between the first intermediate node 262 and the fourth control node 250 (NG2). The first and second switches 260 and 264 may comprise transistor switches as well known to those skilled in the art. The state of the first and second switches 260 and 264 is commonly controlled by a first enable signal (EN_VTH). When the first enable signal is inactive (logic low, for example), the first and second switches 260 and 264 are open. However, when the first enable signal is active (logic high, for example), the first and second switches 260 and 264 are closed, and this causes the shunting of the conduction (drain) terminal (at the low side node 210) to the fourth control node 250 (NG2) for the transistor 242. A first current source 266 is coupled to source fixed current into the first intermediate node 262. Thus, when the first enable signal is active and the first and second switches 260 and 264 are closed, and a fixed current is sourced to charge the parasitic gate capacitance at the fourth control node 250 (NG2) of transistor 242.

The circuit 200 further comprises an analog-to-digital converter (ADC) circuit 268 having an input coupled through a third switch 274 to the fourth control node 250 (NG2). The third switch 274 may comprise a transistor switch as well known to those skilled in the art. The state of the third switch 274 is commonly controlled with the states of the first and second switches 260 and 264 by the first enable signal (EN_VTH). Thus, when the first enable signal is inactive (logic low, for example), the first, second and third switches 260, 264 and 274 are open. However, when the first enable signal is active (logic high, for example), the first, second and third switches 260, 264 and 274 are closed. In this configuration the input of the analog-to-digital converter circuit 268 is coupled to the fourth control node 250 (NG2), and the analog-to-digital converter circuit 268 operates to sample the voltage at the fourth control node 250 (NG2), when the conduction (drain) terminal is shunted to the low side node 210 to the fourth control node 250 (NG2), and thus measure the threshold voltage of the transistor 242. The sampled threshold voltage is stored in a latch circuit 276 coupled to the output of the analog-to-digital converter circuit 268.

The circuit 200 still further comprises digital-to-analog converter (DAC) circuit 280 having a first input coupled to an output of the latch circuit 276. The digital-to-analog converter circuit 280 functions to convert the digital value of the measured threshold voltage of the transistor 242 (as stored in the latch) to an analog output value. An adjustment circuit in the form of a negative temperature coefficient resistance 282 is coupled to a second input of the digital-to-analog converter circuit 280. This negative temperature coefficient resistance 282 functions as a temperature sensor operable to sense a temperature of the transistor 242. The sensed temperature of the transistor 242 is used to offset the digital value of the measured threshold voltage of the transistor 242 by a value and thus compensate for variation in transistor threshold voltage as a function of temperature. The use of the temperature adjustment circuit may not be needed in all applications of the circuit 200, and thus presents an optional feature. Those skilled in the art will recognize situations where use of the temperature adjustment circuit is advantageous, and further will be able to configure the adjustment circuit and digital-to-analog converter circuit 280 to implement an accurate offsetting of the digital value of the measured threshold voltage of the transistor 242 to compensate for variation in transistor threshold voltage as a function of temperature.

The circuit 200 further comprises a fourth switch 284 coupled between an output of the digital-to-analog converter circuit 280 and a second intermediate node 286. A capacitor 288 is coupled between the second intermediate node 286 and a reference voltage node (in this case comprising the second and fourth supply nodes 228 and 248 receiving the low supply voltage (ground)). The capacitor 288 stores a voltage (VREF_BUF) applied to the non-inverting input of a unitary gain voltage buffer circuit 290. The circuit 290 in one implementation comprises an operational amplifier circuit having its non-inverting input terminal coupled to the second intermediate node 286, and its inverting input terminal coupled to its output terminal. The output terminal of the buffer circuit 290 is coupled through a fifth switch 292 to the fourth control node 250 (NG2) for transistor 242. The fourth and fifth switches 284 and 292 may comprise transistor switches as well known to those skilled in the art. The state of the fourth switch 284 is controlled by a second enable signal (ENA). The state of the fifth switch 292 is controlled by a third enable signal (ENB). When the second and third enables signals are inactive (logic low, for example), the fourth and fifth switches 284 and 292 are open. However, when the second and third enable signals are active (logic high, for example), the fourth and fifth switches 284 and 292 are closed.

The circuit 200 still further comprises a second current source 296 coupled to source fixed current into the second intermediate node 286 through a sixth switch 298. The sixth switch 298 may comprise a transistor switch as well known to those skilled in the art. The state of the sixth switch 298 is controlled by a fourth enable signal (EN_OSC). When the fourth enable signal is inactive (logic low, for example), the sixth switch 298 is open. However, when the fourth enable signal is active (logic high, for example), the sixth switch 298 is closed, and a fixed current is sourced to charge the capacitor 288 and increase the voltage (VREF_BUF) applied to the non-inverting input of a unitary gain voltage buffer circuit 290. The fourth enable signal is an oscillating signal, and thus cyclic activations of the sixth switch 298 will produce a stepped increase in the voltage (VREF_BUF). The value of the fixed current output by the second current source 296 is set by the value of a control resistor 300. The fourth enable signal (EN_OSC) may, for example, be generated by logically ANDing an enable signal with an oscillating clock signal, wherein the oscillating clock signal may comprise an oscillating clock signal operable to clock operations performed in connection with controlling and driving the load 208. It will be understood, however, that in some implementations an oscillating signal is not needed, and as such the switch 298 may be controlled by the enable signal directly.

Figure 5:
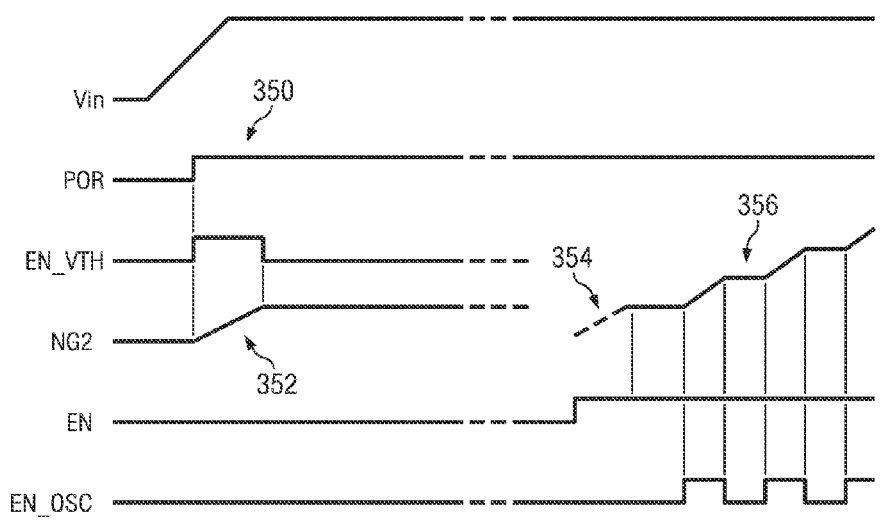
FIG. 5 is timing and voltage plot illustrating operation of the circuit of FIG. 3.

Operation of the circuit 200 in performing an open loop control function is as follows:

STEP 1: Measurement of the threshold voltage of the transistor 242. As discussed above, the first enable signal (EN_VTH) is controlled to be active, and the first, second and third switches 260, 264 and 274 are closed (FIG. 5, reference 350). This shorts the drain and gate (conduction and control) terminals of the transistor 242 together. The first current source 266 charges the gate (control) terminal of the transistor 242 based on a fixed sourced current value (for example, 100 uA), and the analog-to-digital converter circuit 268 samples the gate (control) node voltage to thus measure the threshold voltage of the transistor 242 (FIG. 5, reference 352). The sampled threshold voltage is stored in the latch circuit 276. That sampled threshold voltage, adjusted to account for temperature (if needed or desired), is made available as a voltage value present at the output of the digital-to-analog converter circuit 280. In a preferred implementation, this threshold voltage measurement operation is performed at powering up of the load 208 by supply voltage Vin. The power on reset (POR) signals change of state of the first enable signal (EN_VTH) and closure of the first, second and third switches 260, 264 and 274 to make and store the threshold measurement. Alternatively, the measurement can be made during operation when there is a suitable free time interval according to the application. In this case, the negative temperature offset compensation is not required as the measurement of threshold voltage is being made in real time (and at a current operating temperature).

STEP 2: Pre-charge the gate (control) node of transistor 242 to the sampled threshold voltage. Next, the first enable signal (EN_VTH) is controlled to be inactive, and the second and third enable signals (ENA and ENB) are controlled to be active. This turns on the fourth and fifth switches 284 and 292. The voltage (VREF_BUF) stored on the capacitor 288 is initially set to equal the voltage value present at the output of the digital-to-analog converter circuit 280 (FIG. 5, reference 354). The buffer circuit 290 passes that voltage (VREF_BUF) for application to the gate (control) node of the transistor 242. It is important to recognize that the buffer circuit 290 must be designed with a large current capability in order to quickly charge the gate capacitance of the transistor 242 to the sampled threshold voltage (possibly with temperature compensation).

STEP 3: Use adjustable current to charge the gate (control) node of transistor 242 so as to control the slope of transistor 242 turn on. Next, the second enable signal (ENA) is deactivated, the third enable signal (ENB) remains active, and the fourth enable signal (EN_OSC) is controlled to be active. As discussed above, the fourth enable signal (EN_OSC) is an oscillating signal, and thus current from the second current source 296 is cyclically sourced to the capacitor 288. Thus, current is injected with each oscillating pulse causing a corresponding multi-step increase in capacitor voltage (FIG. 5, reference 356). Because the second enable signal is active, the increased capacitor voltage (VREF_BUF) is passed for application to the gate (control) node of the transistor 242. As the gate voltage increases, the transistor 242 correspondingly turns on. The slope of the transistor 242 turn on is controlled by the rate of change in the capacitor voltage (VREF_BUF) and thus is a function of the fixed current of the second current source 296 and the duty cycle of the oscillating fourth enable signal (EN_OSC).

Figure 4:
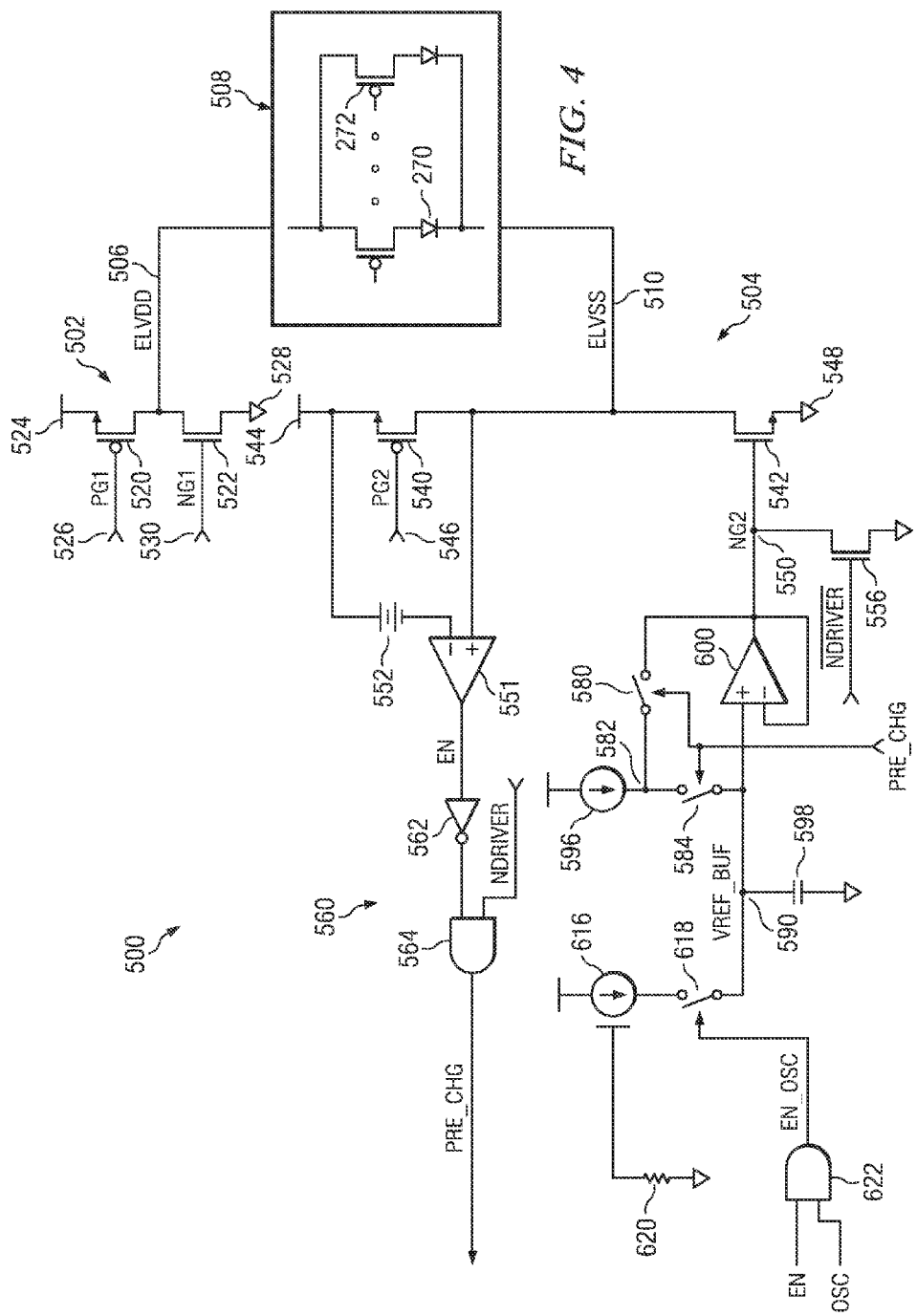
FIG. 4 is a diagram of a second embodiment of an open loop control circuit.

Reference is now made to FIG. 4 showing a diagram of a second embodiment of an open loop control circuit 500. The circuit 500 includes a high side driver 502 and a low side driver 504. The output of the high side driver 502 is coupled to a high side node (ELVDD) 506 of a load 508. The output of the low side driver 504 is coupled to a low side node 510 (ELVSS) of the load 508. In the exemplary implementation of FIG. 4, the load 508 is a display panel of an LCD or AMOLED type which includes a plurality of diodes 270, each diode coupled in series with a control transistor 272 between the high side node (ELVDD) 506 and the low side node 510 (ELVSS). It will be understood, however, that the load 508 may comprise any suitable load driven from both the high and low side.

The high side driver 502 comprises a pair of series connected transistors 520 and 522. The transistor 520 is of the p-channel MOSFET type and the transistor 522 is of the n-channel MOSFET type. These transistors are coupled in series through their source-drain paths. It will be understood that transistors of other type may instead be used, the reference to p-channel and n-channel MOSFET devices being exemplary only of a preferred implementation. P-channel MOSFETs, n-channel MOSFETs, bi-polar devices and/or IGFET type devices may alternatively be used.

The transistor 520 includes a conduction (source) terminal coupled to a first power supply node 524 and a conduction (drain) terminal coupled to the high side node 506. A control (gate) terminal of the transistor 520 is coupled to a first control node 526 (PG1). The transistor 522 includes a conduction (drain) terminal coupled to the high side node 506 and a conduction (source) terminal coupled to a second power supply node 528. A control (gate) terminal of the transistor 522 is coupled to a second control node 530 (NG1).

The low side driver 504 comprises a pair of series connected transistors 540 and 542. The transistor 540 is of the p-channel MOSFET type and the transistor 542 is of the n-channel MOSFET type. These transistors are coupled in series through their source-drain paths. It will be understood that transistors of other type may instead be used, the reference to p-channel and n-channel MOSFET devices being exemplary only of a preferred implementation. P-channel MOSFETs, n-channel MOSFETs, bi-polar devices and/or IGFET type devices may alternatively be used.

The transistor 540 includes a conduction (source) terminal coupled to a third power supply node 544 and a conduction (drain) terminal coupled to the low side node 510. A control (gate) terminal of the transistor 540 is coupled to a third control node 546 (PG2). The transistor 542 includes a conduction (drain) terminal coupled to the low side node 510 and a conduction (source) terminal coupled to a fourth power supply node 548. A control (gate) terminal of the transistor 542 is coupled to a fourth control node 550 (NG2).

The first and third power supply nodes 524 and 544 are preferably coupled to receive high supply voltages. These may, for example, be different high supply voltages, or the same high supply voltage, depending on circuit application.

The second and fourth supply nodes 528 and 548 are preferably coupled to receive low supply voltages. These may, for example, be different low supply voltages, or the same low supply voltage (for example, ground), depending on circuit application.

The circuit 500 comprises a comparator circuit 551 having a first (positive) input terminal coupled to the low side node 510 and a second (negative) input terminal coupled, through a voltage offset 552 (for example, of 2.0V), to the conduction (source) terminal of the transistor 540 (i.e., coupled to the third power supply node 544). The comparator circuit 551 has an output from which is generated a first enable (EN) signal. The comparator circuit 551 functions as a sensing circuit to detect when the transistor 542 has been turned on. The first enable signal is inactive (for example, logic low) when the transistor 542 sensed to be off, and is active (for example, logic high) when the transistor is sensed to be on (said sensing triggered by the voltage at the low side node 510 differing from the voltage at the third power supply node 544 by more than the voltage offset 552).

An activation transistor 556 is coupled between the fourth control node 550 (NG2) and fourth supply node 548. Specifically, the activation transistor 556 has a conduction (drain) terminal coupled to the fourth control node 550 (NG2) and a conduction (source) terminal coupled to the fourth supply node 548. In this configuration, the transistor 556 is an n-channel MOSFET type transistor. The control (gate) terminal of transistor 556 receives an activation signal (NDRIVER (bar)). When the activation signal (NDRIVER(bar)) is logic high, the transistor 556 is turned on and the fourth control node 550 (NG2) is clamped to the fourth supply node 548 (ground). This prevents turn on of the transistor 542. Conversely, when the activation signal (NDRIVER(bar)) is logic low, the transistor 556 is turned off and this permits transistor 542 to be turned on.

The first enable (EN) signal is logically combined with the activation signal (NDRIVER; note: this is the logical inversion of the signal previously discussed) in logic circuitry 560 to generate a second enable (PRE_CHG) signal. The logic circuitry 560 comprises a NOT gate 562 which inverts the logic state of the first enable (EN) signal, and an AND gate 564 which logically combines the inverted first enable (EN) signal with the activation signal (NDRIVER). The logic circuitry 560 essentially functions as a pulse generator that outputs a one-shot pulse for the second enable (PRE CHG) signal. This one-shot pulse has a leading edge responsive to the change in state of the activation signal (NDRIVER) to logic high (i.e., the logic low activation signal NDRIVER (bar)), and a trailing edge responsive to the logic high state of the first enable (EN) signal (i.e., the sensing of the transistor 542 turning on with a certain voltage drop in the low side node 510 (ELVSS) voltage as discussed above).

The circuit 500 further comprises a first switch 580 coupled between the fourth control node 550 (NG2) and a first intermediate node 582, and a second switch 584 coupled between the first intermediate node 582 and a second intermediate node 590. The first and second switches 580 and 584 may comprise transistor switches as well known to those skilled in the art. The state of the first and second switches 580 and 584 is commonly controlled by the second enable (PRE_CHG) signal. When the second enable signal is inactive (logic low, for example), the first and second switches 580 and 584 are open. However, when the second enable signal is active (logic high, for example), the first and second switches 580 and 584 are closed. A first current source 596 is coupled to source fixed current into the first intermediate node 582.

In response to a logic low activation signal (NDRIVER (bar)), the logical complement activation signal (NDRIVER) goes to logic high and the second enable (PRE_CHG) signal is active. The first and second switches 580 and 584 are closed. Current from the first current source 596 charges the parasitic gate capacitance at the fourth control node 550 (NG2) of the transistor 542 and the fourth control node 550 (NG2) voltage rises. As the transistor 542 begins to turn on, current flows from the low side node 510 to the fourth supply node 548 (ground), and the voltage on the low side node 510 (ELVSS) decreases. This decrease in low side node 510 (ELVSS) voltage, indicative of transistor 542 being turned on, is sensed by the comparator circuit 551, whose output first enable (EN) signal switches from the inactive (for example, logic low) state to the active (for example, logic high) state. The second enable (PRE_CHG) signal is then switched to an inactive logic state and the first and second switches 580 and 584 are opened.

A capacitor 598 is coupled between a second intermediate node 590 and a reference voltage node (in this case comprising the second and fourth supply nodes 528 and 548 receiving the low supply voltage (ground)). The capacitor 598 stores a voltage (VREF_BUF) applied to the non-inverting input of a unitary gain voltage buffer circuit 600. The circuit 600 in one implementation comprises an operational amplifier circuit having its non-inverting input terminal coupled to the second intermediate node 590, and its inverting input terminal coupled to its output terminal. The output terminal of the circuit 600 is coupled to the fourth control node 550 (NG2).

Thus, when the second enable (PRE_CHG) signal is active and the first and second switches 580 and 584 are momentarily closed by the one-shot pulse of the second enable signal, a fixed current is sourced to charge the parasitic gate capacitance of the fourth control node 550 (NG2) for the transistor 242 to a threshold voltage of the transistor 542. That charged threshold voltage is further stored through charge-sharing in the capacitor 598 at the second intermediate node 590 as an initial value of the voltage (VREF_BUF). This charging operation lasts until the sensed voltage drop of low side node 510 (ELVSS) voltage exceeds the threshold set by the voltage offset 552 and the first and second switches 580 and 584 are opened.

The circuit 500 still further comprises a second current source 616 coupled to source fixed current into the second intermediate node 590 through a third switch 618. The third switch 618 may comprise a transistor switch as well known to those skilled in the art. The state of the third switch 618 is controlled by a third enable signal (EN_OSC). When the third enable signal is inactive (logic low, for example), the third switch 618 is open. However, when the third enable signal is active (logic high, for example), the third switch 618 is closed, and a fixed current is sourced to charge the capacitor 598 and increase the voltage (VREF_BUF) applied to the non-inverting input of the unitary gain voltage buffer circuit 600. The third enable signal is an oscillating signal, and thus cyclic activations will produce a stepped increase in the voltage (VREF_BUF). The value of the fixed current output by the second current source 616 is set by the value of a control resistor 620. The third enable signal (EN_OSC) is generated by a logic circuit which includes an AND gate 622 operable to logically AND the first enable (EN) signal with a oscillating clock (OSC) signal, wherein the oscillating clock signal may comprise an oscillating clock signal operable to clock operations performed in connection with controlling and driving the load 508. The comparator circuit 551 changes the logic state of the first enable (EN) signal to logic high in response to sensing that transistor 542 has turned on. This enables application of the oscillating third enable signal (EN_OSC) to actuate the third switch 618.

Figure 6:
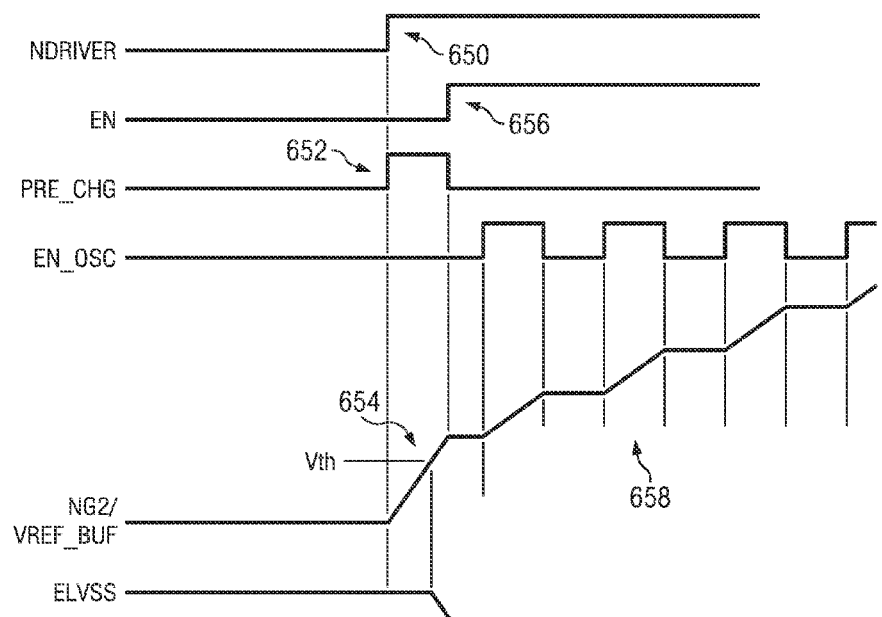
FIG. 6 is a timing and voltage plot illustrating operation of the circuit of FIG. 4.

Operation of the circuit 500 in performing an open loop control function is as follows:

STEP 1: Pre-charge phase. Transistor 542 is controlled through its fourth control node 550 (NG2) in response to the activation signal (NDRIVER(bar)) transitioning from logic high to logic low (and thus turning off transistor 556), thus permitting a turn on of transistor 542 (FIG. 6, reference 650). The complement of the activation signal (NDRIVER) causes a state change in the second enable (PRE_CHG) signal to logic high and the first and second switches 580 and 584 are closed (FIG. 6, reference 652). The positive input and output of the unitary gain voltage buffer circuit 600 are shorted together so that the positive input terminal voltage follows the voltage at the fourth control node 550 (NG2), and the first current source 596 charges the gate (control) terminal (parasitic capacitance) of the transistor 542 based on a fixed sourced current value (for example, 100 uA). This causes the transistor 542 to begin to turn on (FIG. 6, reference 654). With this turn on, the low side node 510 (ELVSS) voltage drops. This drop in voltage sensed by the comparator circuit 551, and the logical output of the comparator circuit which generates the first enable (EN) signal changes state (FIG. 6, reference 656). The change in state of the first enable (EN) signal is processed by NOT gate 562 and AND gate 564 to terminate the one-shot pulse of the second enable (PRE_CHG) signal. This precharge operation is helpful to save time required for turning on the transistor 542.

STEP 2: Use adjustable current to charge the gate (control) node of transistor 542 so as to control the slope of transistor 542 turn on. Following completion of the pre-charge, the first and second switches 580 and 584 open (with the change in state of the first enable (EN) signal). The active second enable signal (EN) controls application of the oscillating the third enable signal (EN_OSC) to cyclically turn on the third switch 618 and thus current is injected with each oscillating pulse causing a corresponding multi-step increase in capacitor voltage (FIG. 6, reference 658). The increased capacitor voltage (VREF_BUF) is passed for application to the gate (control) node of the transistor 542. As the gate voltage increases, the transistor 542 correspondingly turns on. The slope of the transistor 542 turn on is controlled by the rate of change in the capacitor voltage (VREF_BUF) and thus is a function of the fixed current of the second current source 616 and the duty cycle of the oscillating third enable signal (EN_OSC).

What is claimed is:

1. A circuit, comprising:
   a low side driver including a first transistor coupled in series with a second transistor at a low side voltage node, said low side voltage node configured to be coupled to a load;
   a capacitance element configured to store a voltage;
   a voltage buffer circuit having an input coupled to receive the voltage stored by the capacitance element and an output coupled to drive a control node of the second transistor with said stored voltage;
   a first current source; and
   a first switch coupled between the first current source and the input of the voltage buffer circuit, wherein said first switch is configured to be actuated by an enable signal to source current from said first current source to said capacitance element and cause a stepped increase in the stored voltage.

2. The circuit of claim 1, wherein the enable signal is an oscillating enable signal so as to cyclically source current from said first current source to said capacitance element and cause a multi-step increase in the stored voltage.

3. The circuit of claim 1, further comprising a sensed circuit configured to sense a threshold voltage of the second transistor and store said sensed threshold voltage as an initial value of the voltage stored in said capacitance element.

4. The circuit of claim 3, wherein the sensed circuit configured to sense the threshold voltage of the second transistor comprises:
   a voltage sensing circuit; and
   a second switch coupled between the control node of the second transistor and an input of the voltage sensing circuit and selectively actuated to permit the voltage sensing circuit to sense a voltage at the control node of the second transistor, said sensed voltage being indicative of the threshold voltage of the second transistor.

5. The circuit of claim 4, wherein the sensed circuit configured to sense the threshold voltage of the second transistor further comprises:
   a third switch coupled between a conduction node of the second transistor and an intermediate node;
   a fourth switch coupled between the intermediate node and control node of the second transistor;
   wherein the second, third and fourth switches are selectively actuated in common when sensing the voltage at the control node of the second transistor during a voltage sensing operation.

6. The circuit of claim 5, wherein the sensed circuit configured to sense the threshold voltage of the second transistor further comprises a second current source configured to source current to said intermediate node.

7. The circuit of claim 4, wherein the voltage sensing circuit comprises an analog-to-digital converter and wherein the sensed circuit configured to sense the threshold voltage of the second transistor further comprises a latch circuit configured to store a digital value of the sensed voltage at the control node of the second transistor.

8. The circuit of claim 7, wherein the sensed circuit configured to sense the threshold voltage of the second transistor further comprises a digital-to-analog converter configured to convert the digital value to an analog voltage value.

9. The circuit of claim 8, further comprising a temperature sensing circuit configured to sense a temperature of the second transistor, said digital-to-analog converter operable in response to said sensed temperature to adjust the threshold voltage of the second transistor as a function of the sensed temperature.

10. The circuit of claim 8, further comprising a fifth switch coupled between an output of the digital-to-analog converter and the input of the voltage buffer circuit, the fifth switch selectively actuated to pass the analog voltage value for storage as the initial value stored in said capacitance element.

11. The circuit of claim 10, further comprising a sixth switch coupled between the output of the buffer circuit and the control node of the second transistor; wherein the fifth and sixth switches are selectively actuated in common when pre-charging the control node of the second transistor to the sensed threshold voltage of the second transistor.

12. The circuit of claim 11, wherein the fifth switch is de-actuated and the sixth switch is actuated during the stepped increase in the stored voltage.

13. The circuit of claim 1, further comprising:
   a second switch coupled between the output of the voltage buffer and an intermediate node;
   a third switch coupled between the intermediate node and the input of the voltage buffer;
   wherein the second and third switches are selectively actuated in common when pre-charging the control node of the second transistor to a pre-charge voltage, said pre-charge voltage stored as an initial value of the voltage stored in said capacitance element.

14. The circuit of claim 13, further comprising a control transistor coupled between the control node of the second transistor and a reference voltage, said control transistor having a control node configured to receive a drive control signal, said second and third switches being selectively actuated in common in response to said drive control signal having a logic state which turns off said control transistor.

15. The circuit of claim 14, further comprising a turn-on sense circuit configured to sense turn-on of said second transistor.

16. The circuit of claim 15, further comprising logic circuitry configured to selectively de-actuate the second and third switches in common in response to said turn-on sense circuit sensing of second transistor turn-on.

17. The circuit of claim 16, wherein said turn-on sense circuit comprises a comparator circuit configured to compare a first voltage at the low side voltage node to another reference voltage.

18. The circuit of claim 17, wherein said logic circuitry comprises:
   a NOT gate configured to invert a signal output from said comparator circuit; and
   an AND gate configured to logically AND an output of the NOT gate with an inversion of said drive control signal.

19. The circuit of claim 15, further comprising circuitry configured to apply said enable signal to said first switch in response to said turn-on sense circuit sensing turn-on of said second transistor.

20. The circuit of claim 1, wherein said load comprises a display panel of the LCD or AMOLED type.

21. The circuit of claim 1, further comprising a high side driver including a third transistor coupled in series with a fourth transistor at a high side voltage node, said high side voltage node configured to be coupled to said load.

22. A circuit configured to drive a low side driver including a drive transistor coupled between a low side voltage node of a load and a reference voltage, comprising:
   a first circuit configured to sense a threshold voltage of the drive transistor;
   a capacitance element configured to store a voltage;
   a second circuit configured to cause the sensed threshold voltage to be stored as an initial voltage stored by said capacitance element;

a first current source;

a first switch coupled between the first current source and the capacitance element, where said first switch is configured to be actuated by an enable signal so as to source current from said first current source to said capacitance element and cause a stepped increase of the voltage stored by said capacitance element from said initial voltage; and a voltage buffer circuit having an input coupled to receive the voltage stored by the capacitance element and an output coupled to drive a control node of the drive transistor with said stored voltage.

23. The circuit of claim 22, wherein the enable signal is an oscillating enable signal so as to cyclically source current from said first current source to said capacitance element and cause a multi-step increase in the stored voltage.

24. The circuit of claim 22, wherein the first circuit configured to sense the threshold voltage of the drive transistor comprises:

a voltage sensing circuit;

a second switch coupled between the control node of the drive transistor and an input of the voltage sensing circuit;

a third switch coupled between a conduction node of the drive transistor and an intermediate node;

a fourth switch coupled between the intermediate node and control node of the drive transistor; and a second current source configured to source current to said intermediate node;

wherein the second, third and fourth switches are selectively actuated in common when sensing the voltage at the control node of the drive transistor during a voltage sensing operation.

25. The circuit of claim 24, wherein the voltage sensing circuit further comprises:

a digital-to-analog converter configured to convert a digital value of the sensed threshold voltage to an analog voltage value, said analog voltage value selectively coupled to said capacitance element for storage as said initial voltage.

26. A circuit configured to drive a low side driver including a first drive transistor coupled between a low side voltage node of a load and a reference voltage, comprising:

a control transistor coupled between the control node of the first drive transistor and the reference voltage, said control transistor having a control node configured to receive a drive control signal;

a capacitance element configured to store a voltage;

a first circuit configured to pre-charge the control node of the first drive transistor to a voltage which is stored as an initial voltage stored by said capacitance element, said first circuit actuated in response to said drive control signal;

a first current source;

a first switch coupled between the first current source and the capacitance element, where said first switch configured to be actuated by an enable signal so as to source current from said first current source to said capacitance element and cause a stepped increase in the stored voltage; and a voltage buffer circuit having an input coupled to receive the voltage stored by the capacitance and an output coupled to drive a control node of the first drive transistor with said stored voltage.

27. The circuit of claim 26, wherein the enable signal is an oscillating enable signal so as to cyclically source current from said first current source to said capacitance element and cause a multi-step increase in the stored voltage.

28. The circuit of claim 26, further comprising:

a second switch coupled between the output of the voltage buffer and an intermediate node;

a third switch coupled between the intermediate node and the input of the voltage buffer;

a second current source configured to source current to said intermediate node;

wherein the second and third switches are selectively actuated in common in response to said drive control signal when pre-charging the control node of the first drive transistor.

29. The circuit of claim 28, wherein said low side driver further includes a second drive transistor coupled in series with the first drive transistor at the low side voltage node, further comprising a turn-on sense circuit coupled across the second drive transistor and configured to sense turn-on of said first drive transistor and in response thereto selectively de-actuate the second and third switches in common.

30. The circuit of claim 29, further comprising second circuitry configured to apply said oscillating enable signal to said first switch in response to said turn-on sense circuit sensing turn-on of said first drive transistor.

* * * * *